(12) United States Patent
Hymas et al.

(10) Patent No.: US 10,347,728 B1
(45) Date of Patent: Jul. 9, 2019

(54) MEMORY CELL WITH ASYMMETRIC WORD LINE AND ERASE GATE FOR DECOUPLED PROGRAM ERASE PERFORMANCE

(71) Applicant: Microchip Technology Incorporated, Chandler, AZ (US)

(72) Inventors: Mel Hymas, Camas, WA (US); James Walls, Mesa, AZ (US); Sonu Daryanani, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/922,571

(22) Filed: Mar. 15, 2018

Related U.S. Application Data

(60) Provisional application No. 62/612,864, filed on Jan. 2, 2018, provisional application No. 62/613,036, filed on Jan. 2, 2018.

(51) Int. Cl.

| | |
|---|---|
| *H01L 29/00* | (2006.01) |
| *H01L 29/423* | (2006.01) |
| *H01L 27/11521* | (2017.01) |
| *G11C 16/08* | (2006.01) |
| *G11C 16/04* | (2006.01) |
| *G11C 16/14* | (2006.01) |
| *H01L 29/78* | (2006.01) |

(52) U.S. Cl.
CPC .. *H01L 29/42328* (2013.01); *H01L 27/11521* (2013.01); *G11C 16/0408* (2013.01); *G11C 16/08* (2013.01); *G11C 16/14* (2013.01); *H01L 29/7841* (2013.01)

(58) Field of Classification Search
CPC ...................... H01L 27/11521; H01L 29/7841
See application file for complete search history.

(56) References Cited

U.S. PATENT DOCUMENTS

| | | | | |
|---|---|---|---|---|
| 6,101,131 A | * | 8/2000 | Chang | G11C 16/0416 257/E21.689 |
| 6,876,031 B1 | * | 4/2005 | Kao | G11C 16/0416 257/315 |
| 7,265,411 B2 | * | 9/2007 | Kang | H01L 27/115 257/314 |

(Continued)

FOREIGN PATENT DOCUMENTS

JP 2001085544 A 3/2001 ......... H01L 21/8247

OTHER PUBLICATIONS

International Search Report and Written Opinion, Application No. PCT/US201/066360, 16 pages, dated Mar. 14, 2019.

*Primary Examiner* — Nicholas J Tobergte
(74) *Attorney, Agent, or Firm* — Slayden Grubert Beard PLLC (57) ABSTRACT

A memory cell, e.g., a flash memory cell, includes a substrate, a floating gate formed over the substrate, and a word line and an erase gate formed over the floating gate. The word line overlaps the floating gate by a first lateral overlap distance, and the erase gate overlaps the floating gate by a second lateral overlap distance that is substantially greater than the first lateral distance. This configuration allows the program and erase coupling to the floating gate to be optimized independently, e.g., to decrease or minimize the program current and/or increase or maximize the erase current for the cell.

26 Claims, 5 Drawing Sheets

(56) References Cited

U.S. PATENT DOCUMENTS

| | | | |
|---|---|---|---|
| 8,809,930 B2* | 8/2014 | Jeon | H01L 29/7831 |
| | | | 257/311 |
| 9,455,037 B2* | 9/2016 | Hewitt | G11C 16/0416 |
| 2005/0269622 A1* | 12/2005 | Klinger | H01L 27/115 |
| | | | 257/315 |
| 2006/0076607 A1* | 4/2006 | Kang | H01L 27/115 |
| | | | 257/315 |
| 2008/0093647 A1 | 4/2008 | Kang et al. | 257/314 |
| 2008/0111181 A1* | 5/2008 | Park | G11C 16/0441 |
| | | | 257/319 |
| 2014/0151782 A1* | 6/2014 | Tsair | H01L 29/7881 |
| | | | 257/320 |
| 2017/0125432 A1* | 5/2017 | Richter | H01L 27/11531 |
| 2018/0069104 A1* | 3/2018 | Zhou | H01L 21/28273 |

* cited by examiner

MEMORY CELL WITH ASYMMETRIC WORD LINE AND ERASE GATE FOR DECOUPLED PROGRAM ERASE PERFORMANCE

RELATED PATENT APPLICATION

This application claims priority to commonly owned U.S. Provisional Patent Application Nos. 62/612,864 filed Jan. 2, 2018 and 62/613,036 filed Jan. 2, 2018, which are both hereby incorporated by reference herein for all purposes.

TECHNICAL FIELD

The present disclosure relates to memory cells, e.g., flash memory cells, and more particularly, to a split-gate flash memory cell or other memory cell having a floating gate with a decoupled and asymmetric program and erase overlap over the floating gate.

BACKGROUND

Certain memory cells, including flash memory cells, include at least one floating gate that is/are programmed and erased through one or more program/erase gates, word lines, or other conductive element(s). Some memory cells use a common program/erase gate extending over a floating gate to both program and erase the cell. In some implementations, the floating gate is formed by a Poly1 layer, while the program/erase gate is formed by a Poly2 layer that partially overlaps the underlying Poly1 floating gate in the lateral direction.

Figure 1:
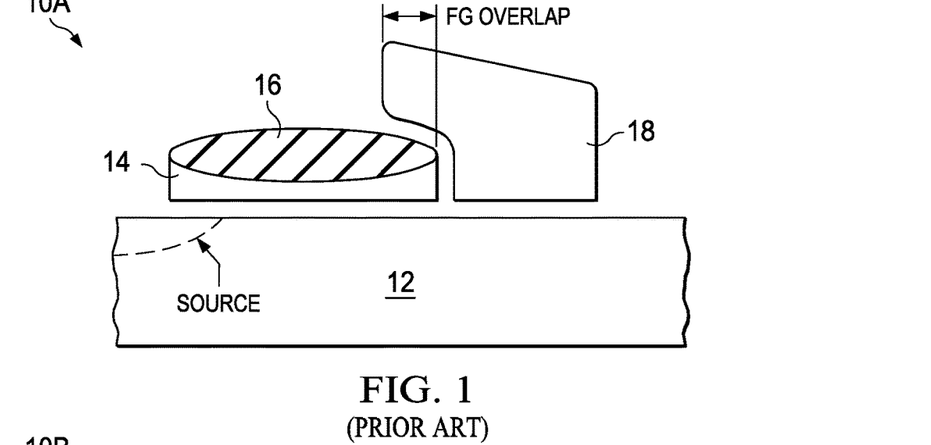
FIG. 1 illustrates a partial cross-sectional view of an example conventional memory cell including a Poly 1 floating gate and a Poly2 common program/erase gate extending partially over the floating gate.

FIG. 1 illustrates a partial cross-sectional view of an example memory cell 10A including a Poly 1 floating gate 14 and overlying "football" oxide 16 formed over a substrate 12, and Poly2 common program/erase gate 18 extending partially over the floating gate 14. A distance of lateral overlap between the program/erase gate 18 and underlying floating gate 14, also referred to as the P1/P2 overlap distance or "FG overlap distance," is indicated in FIG. 1.

The FG overlap distance typically affects both the program and erase characteristics of the cell, including the program and erase current for the cell. In particular, programming efficiency (e.g., lower current) is improved by a smaller FG overlap distance, while erase efficiency (e.g., higher current) is improved by a larger FG overlap distance. Typically, increasing the difference between the erase state current (Ir1) and program state current (Ir0) increases the cell performance/efficiency, and vice versa.

Thus, the erase and program efficiency are antagonistic, and may define a relatively small window for FG overlap distance that provides and effective or desirable difference between program and erase state currents (Ir1/Ir0 difference). Further, the Ir1/Ir0 window is reduced with reduced cell size, due to higher program and erase voltages required in smaller cells, which limits scaling of certain memory cells.

In addition, in cells that include multiple floating gates, e.g., mirrored dual-bitcell flash memory cells, the FG overlap distance may be asymmetrical between the different floating gates due to inherent alignment imperfections or tolerances associated with manufacturing, which may be disadvantageous.

Figure 2:
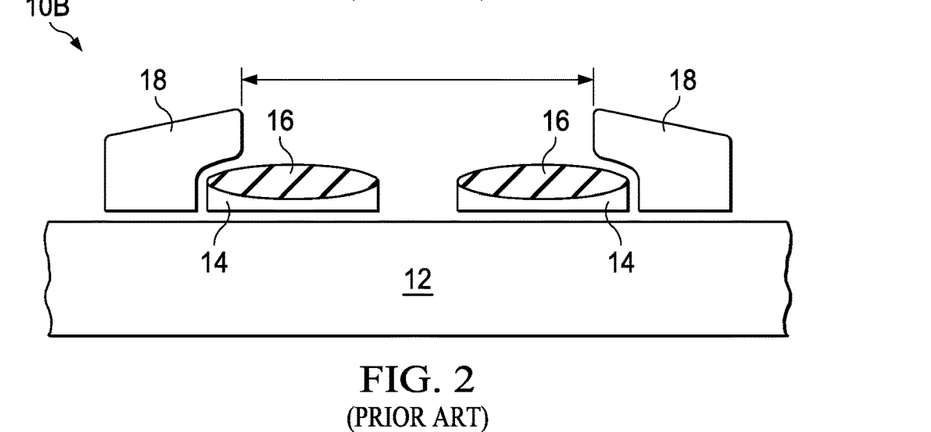
FIG. 2 illustrates an example mirrored memory cell (e.g., a SuperFlash cell) including two floating gates.

FIG. 2 illustrates an example of a mirrored memory cell 10B (e.g., a SuperFlash cell) including two spaced-apart floating gates 14 with a respective program/erase gate 18 formed over each floating gate 14.

Figure 3:
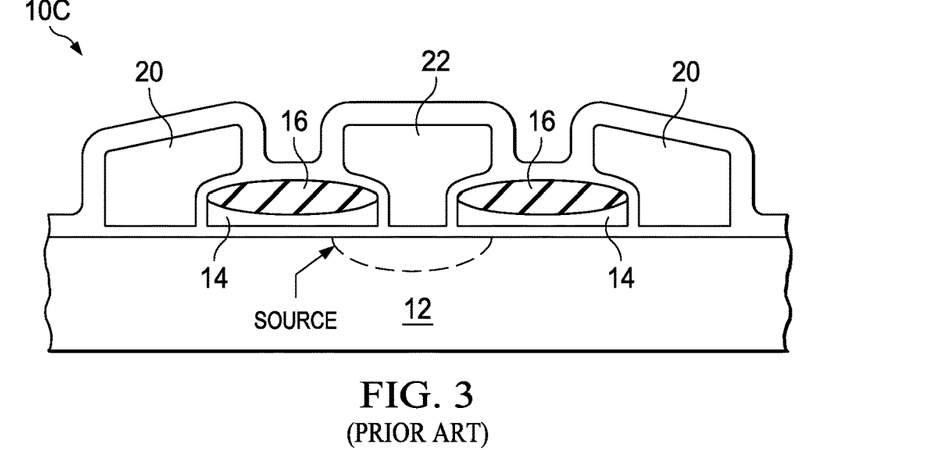
FIG. 3 illustrates another example mirrored memory cell (e.g., a SuperFlash cell) including two floating gates, a word line formed over each floating gate, and a common erase gate formed over both floating gates, such that for each floating gate, the program and erase couplings to the floating gate are decoupled.

FIG. 3 illustrates another example mirrored memory cell 10C (e.g., a SuperFlash cell) including two spaced-apart floating gates 14, a word line 20 formed over each floating gate 14, and a common erase gate or "coupling gate" 22 formed between and extending over both floating gates 14, such that for each floating gate 14, the program and erase couplings to the respective floating gate 14 are decoupled.

SUMMARY

Embodiments of the present disclosure provide a memory cell (e.g., flash memory cell) and method for forming a memory cell having at least one floating gate, and a word line (or other program node) and erase gate (or other erase node) associated with the floating gate, wherein (a) the word line and erase gate are decoupled from each other and (b) the extent to which the word line and erase gate overlap the floating gate is asymmetrical, e.g., the erase gate overlaps the floating gate by a substantially greater extent then the word line overlaps the floating gate. This configuration allows the program and erase coupling to the floating gate to be optimized independently, e.g., to decrease or minimize the program current and/or increase or maximize the erase current for the cell.

One embodiment provides a method of forming a memory cell, including forming a floating gate over a substrate; forming a word line over the floating gate such that the word line overlaps the floating gate by a first lateral distance; and forming an erase gate over the floating gate (e.g., simultaneous with, or separate from the forming of the word line) such that the erase gate overlaps the floating gate by a second lateral distance that is substantially greater than the first lateral distance.

In some embodiments, the memory cell comprises a flash memory cell. For example, the memory cell may comprise any type of SuperFlash memory cell manufactured by Microchip Technology Inc., having a headquarters at 2355 W. Chandler Blvd., Chandler, Ariz. 85224, or a modified version of such memory cells.

In some embodiments, the method includes forming a pair of floating gates of the memory cell, and forming a word line and erase gate over each floating gate, wherein for each floating gate, the respective word line overlaps the respective floating gate by a first respective lateral distance and the respective erase gate overlaps the respective floating gate by a second respective lateral distance that is substantially greater than the first respective lateral distance.

In some embodiments, the erase gates for the pair of floating gates are provided by a shared gate (control gate). In some embodiments, the word line and the erase gate are formed in a common poly layer. For example, in one embodiment, the floating gate is formed in a Poly1 layer, and the word line and erase gate are formed in a Poly2 layer.

In some embodiments, the erase gate-floating gate lateral overlap distance is at least 1.5 times, at least 2 times, at least 3 times, at least 4 times, at least 5 times, at least 6 times, at least 7 times, at least 8 times, at least 9 times, or at least 10 times as great as the word line-floating gate lateral overlap distance. Further, in some embodiments, for a defined voltage level, the program current for the word line is at least 2 times, at least 10 times, at least 100 times, at least 1000 times, at least 5000 times, or at least 10,000 times as large as the program current for the word line or for a conventional cell with symmetrical word line/erase gate overlap over the floating gate.

Another embodiment provides a memory cell including a substrate; a floating gate formed over the substrate; and a word line and an erase gate formed over the floating gate; wherein the word line overlaps the floating gate by a first lateral distance, and the erase gate overlaps the floating gate by a second lateral distance that is substantially greater than the first lateral distance.

In some embodiments, the memory cell includes a pair of floating gates, and a word line and an erase gate over each floating gate, wherein for each floating gate, the respective word line overlaps the respective floating gate by a first lateral distance and the respective erase gate overlaps the respective floating gate by a second lateral distance that is substantially greater than the first lateral distance.

The concepts disclosed herein, e.g., the concepts of decoupling the program FG overlap from the erase FG overlap, with a substantial difference between the program (word line) overlap and erase overlap (i.e., a substantially asymmetric program/erase FG overlap) to optimize the program and erase coupling independently (e.g., to maximize or optimize the Ir1/Ir0 difference), may apply to any suitable memory cell, e.g., certain flash memory cells or other memory cells including a floating gate. For example, the concepts disclosed herein may be applied to the type of memory cell shown in FIG. 3, e.g., by shifting the FG-overlying portions of the word lines and erase gate laterally to provide a substantially asymmetrical program/erase FG overlap over each respective floating gate.

BRIEF DESCRIPTION OF THE DRAWINGS

Example aspects of the present disclosure are described below in conjunction with the figures, in which.

DETAILED DESCRIPTION

Embodiments of the present disclosure provide a memory cell (e.g., flash memory cell) and method for forming a memory cell having at least one floating gate, and a word line (or other program node) and erase gate (or other erase node) associated with the floating gate, wherein (a) the word line and erase gate are decoupled from each other and (b) the extent to which the word line and erase gate overlap the floating gate is asymmetrical, e.g., the erase gate overlaps the floating gate by a substantially greater extent then the word line overlaps the floating gate. This configuration allows the program and erase coupling to the floating gate to be optimized independently, e.g., to decrease or minimize the program current and/or increase or maximize the erase current for the cell.

Figure 4:
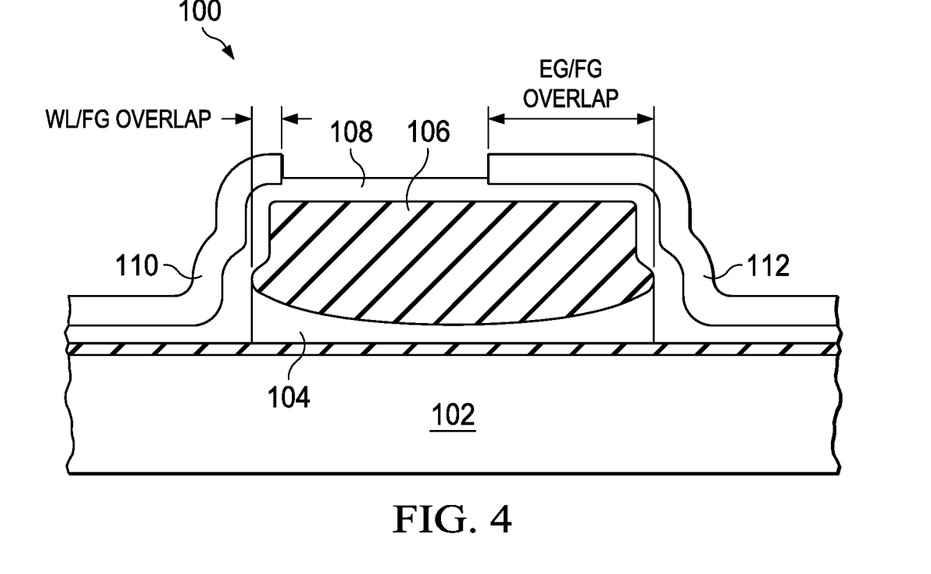
FIG. 4 illustrates a cross-section of an example memory cell formed according to an embodiment of the present invention.

FIG. 4 illustrates a cross-section of an example memory cell structure 100 formed according to an embodiment of the present invention. Memory cell structure 100 includes a floating gate 104 formed over a substrate 102, an oxide region 106 formed over the floating gate 104, tunnel oxide layer 108 formed over the floating gate 104/oxide 106 structure, a word line 110 extending over a first side of the floating gate 104, and an erase gate 112 extending partially over a second side of the floating gate 104. In some embodiments, the floating gate 104 is formed from in a Poly1 layer, and the word line 110 and erase gate 112 are formed (e.g., simultaneously) from a poly2 layer, using known IC manufacturing techniques.

As shown, the word line 110 overlaps the floating gate 104 by a lateral distance indicated as "WL/FG overlap," while the erase gate 112 overlaps the floating gate 104 by a lateral distance indicated as "EG/FG overlap," which is substantially greater than the WL/FG overlap, to thereby define a substantial asymmetry between the program FG overlap and the erase FG overlap, as discussed above. In some embodiments, the WL/FG overlap is at least 1.5 times, at least 2 times, at least 3 times, at least 4 times, at least 5 times, at least 6 times, at least 7 times, at least 8 times, at least 9 times, or at least 10 times as great as the WL/FG overlap.

Figure 5:
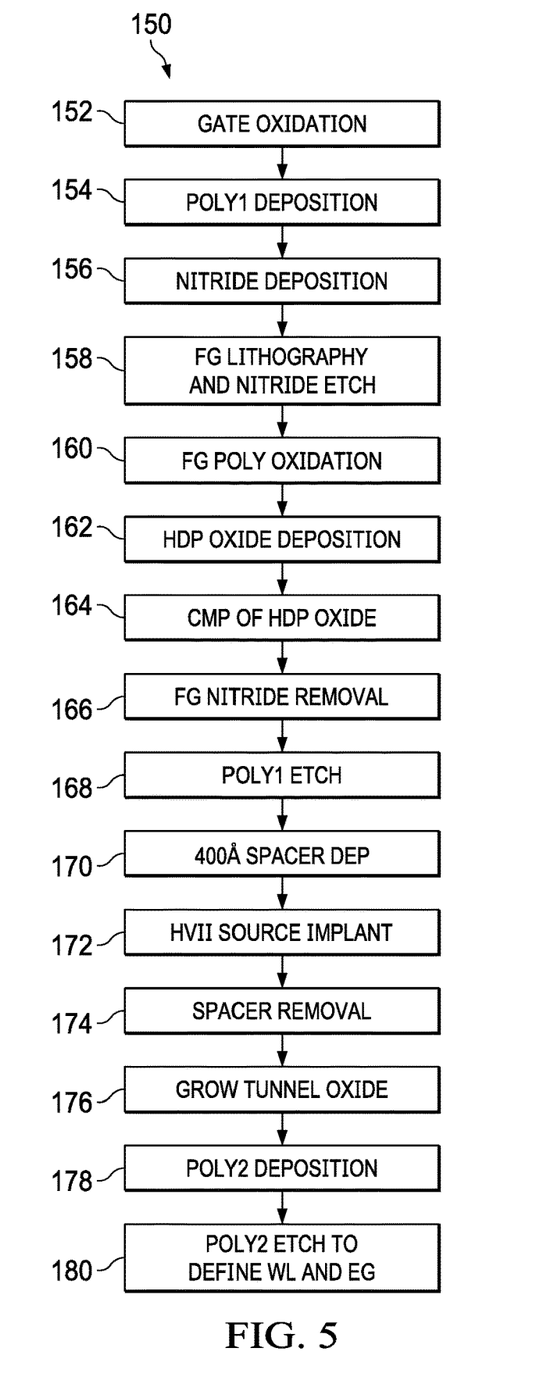
FIG. 5 illustrates an example method of forming the example memory cell structure shown in FIG. 4.

FIG. 5 illustrates an example method 150 of forming the example memory cell structure 100 shown in FIG. 4. At 152, a gate oxidation is performed or occurs on a top surface of substrate 102. At 154, a poly1 layer is deposited over the substrate 102. At 156, a nitride layer is deposited over the poly1 layer 102. At 158, a floating gate structure is formed from the poly1 layer, e.g., by a FG lithography and nitride etch process. At 160, a FG poly oxidation is performed, which may form a football-shaped oxide over the floating gate structure and define the concave upper surface of the floating gate structure. At 162, an HDP oxide deposition may be performed over the football-shaped oxide. At 164, a CMP may be performed on the HDP oxide to define the flat-topped oxide region 106 shown in FIG. 4. At 166, a floating gate nitride removal process may be performed. At 168, a poly1 etch may be performed to define the shape of floating gate 104 shown in FIG. 4, by removing the portions of poly1 on the lateral side of the illustrated floating gate 104.

At 170, a sacrificial spacer layer may be deposited over the structure. For example, the spacer layer may comprise a nitride layer having a thickness in the range of 200 Å-600 Å, or in the range of 300 Å-500 Å, e.g., a thickness of about 400 Å. At 172, a HVII (High Voltage Ion Implant) source implant may be performed, to form a source implant region in the substrate 102 that may be self-aligned with the external lateral edge of the spacer layer. The source implant region may diffuse to define a source region that extends laterally under the floating gate 104. The spacer layer may then be removed at 174. A tunnel oxide 108 may then be formed, e.g., grown, over the structure at 176. At 178, a poly2 layer may be deposited over the structure. At 180, a poly2 etch may be performed to define the word line 110 and erase gate 112, as shown in FIG. 4.

Figure 6:
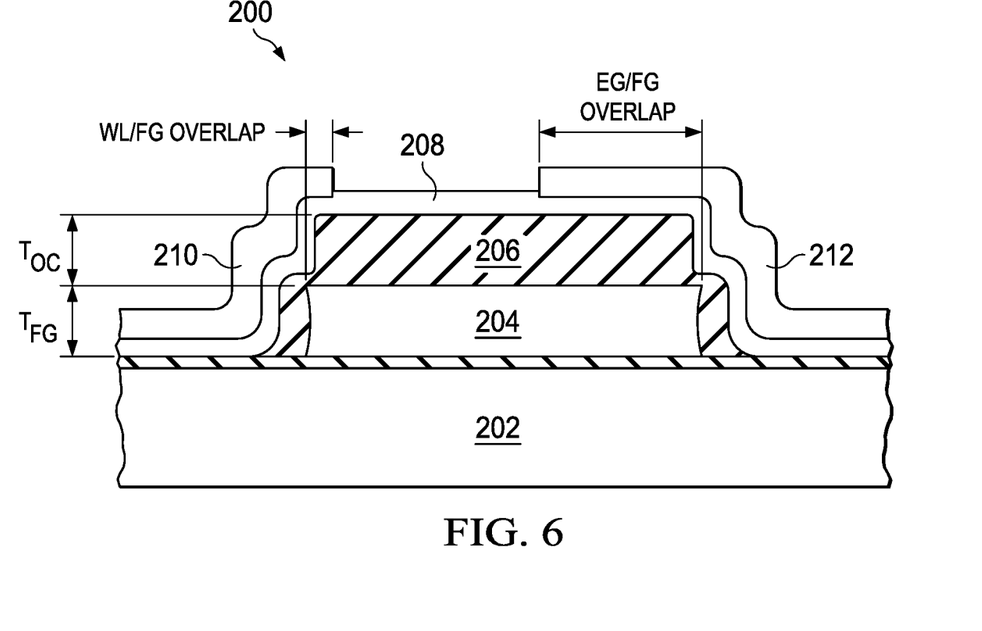
FIG. 6 illustrates a cross-section of an example another example memory cell formed according to an embodiment of the present invention.

FIG. 6 illustrates a portion of another example memory cell 200 formed according to an embodiment of the present invention. In particular, FIG. 5 shows a flat-top floating gate 204, a flat-top oxide cap or "stud" region 206 formed over the flat-top floating gate 204, a word line 210 extending over a first side of the floating gate 204, and an erase gate 212 extending partially over a second side of the floating gate 204. The flat-top floating gate 204 and the overlying flat-top oxide cap or "stud" region 206 may be formed in any suitable manner, for example using the method shown in FIG. 7 or 8, discussed below.

FIG. 6 illustrates certain advantages resulting from the substantially asymmetrical program/erase FG overlap over the flat-top floating gate 204 and flat-top oxide cap 206. For example, reducing the WL/FG overlap may allow for a reduction in the floating gate 204 height/thickness ($T_{FG}$) and/or doping, which may decrease unwanted sidewall coupling between the word line (poly2) 210 and floating gate (poly1) 204. As another example, increasing the EG/FG overlap may allow a reduction of the oxide cap height/thickness ($T_{OC}$), which may increase the coupling between the erase gate (poly2) 212 and floating gate (poly1) 204. Thus, the flat-top FG cell 200 may allow independent control of the poly1 thickness ($T_{FG}$) and/or doping, and the oxide cap thickness $T_{OC}$.

Figure 7:
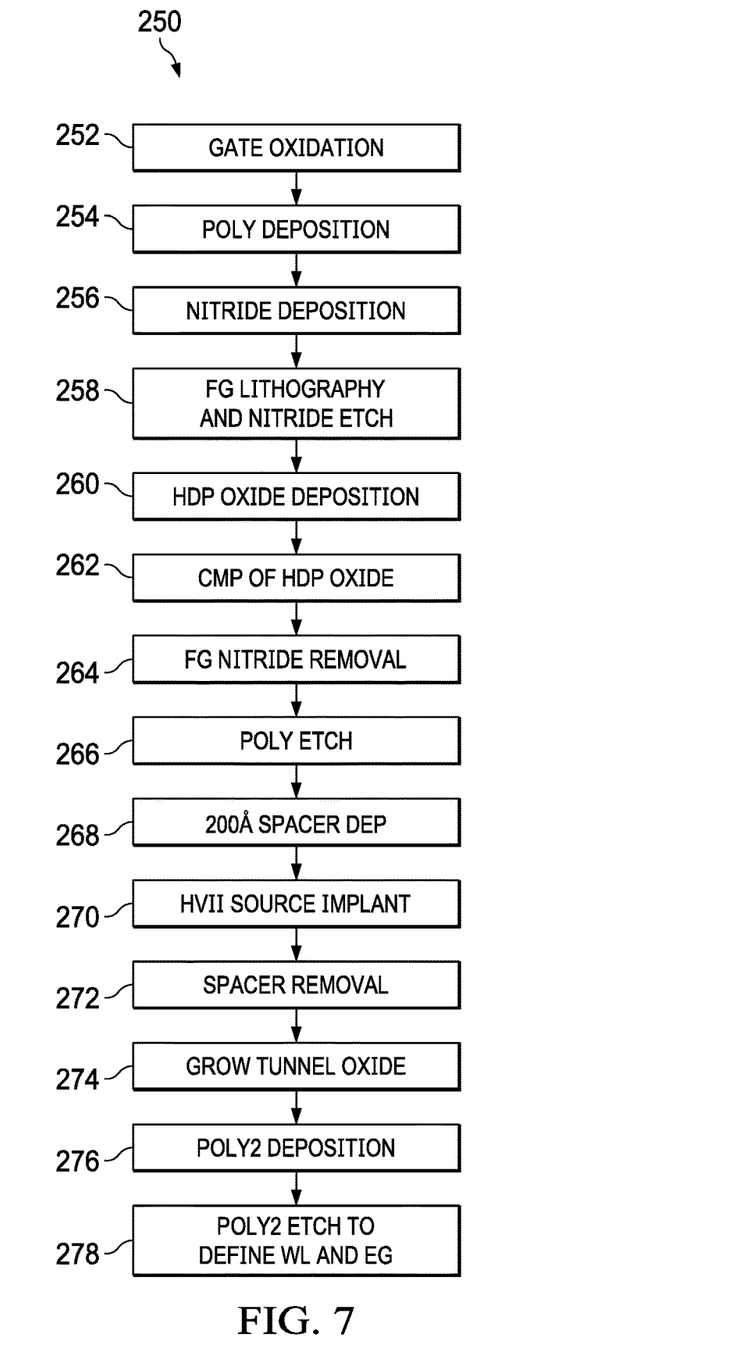
FIG. 7 illustrates an example method of forming the example memory cell structure shown in FIG. 6.

FIG. 7 illustrates an example method 250 of forming the example memory cell structure 200 shown in FIG. 6. At 252, a gate oxidation is performed or occurs on a top surface of substrate 202. At 254, a poly1 layer is deposited over the substrate 202. At 256, a nitride layer is deposited over the poly1 layer 202. At 258, a flat-topped floating gate structure is formed from the poly1 layer, e.g., by a FG lithography and nitride etch process. At 260, an HDP oxide deposition may be performed directly on the flat-topped floating gate structure. Thus, unlike example method 150 (FIG. 5) to form the cell structure 100 shown in FIG. 4, in this embodiment the FG poly oxidation step to form a football-shaped oxide over the floating gate structure (step 160 of method 150 discussed above) may be omitted. At 262, a CMP may be performed on the HDP oxide to define the flat-topped oxide region 206 shown in FIG. 4. At 264, a floating gate nitride removal process may be performed. At 266, a poly1 etch may be performed to define the shape of floating gate 204 shown in FIG. 4, by removing the portions of poly1 on the lateral side of the illustrated floating gate 204.

At 268, a sacrificial spacer layer may be deposited over the structure. Due to reduced oxide pullback, the required or optimal thickness of spacer layer may be reduced as compared with the spacer layer used in the formation of memory cell structure 100 shown in FIG. 4, e.g., at step 170 of method 150 shown in FIG. 5 and discussed above. For example, the spacer layer may comprise a nitride layer having a thickness in the range of 100 Å-400 Å, or in the range of 150 Å-300 Å, e.g., a thickness of about 200 Å. At 270, a HVII (High Voltage Ion Implant) source implant may be performed, to form a source implant region in the substrate 202 that may be self-aligned with the external lateral edge of the spacer layer. The source implant region may diffuse to define a source region that extends laterally under the floating gate 204. The spacer layer may be removed at 272. A tunnel oxide 208 may then be formed, e.g., grown, over the structure at 274. At 276, a poly2 layer may be deposited over the structure. At 278, a poly2 etch may be performed to define the word line 210 and erase gate 212, as shown in FIG. 4.

Figure 8:
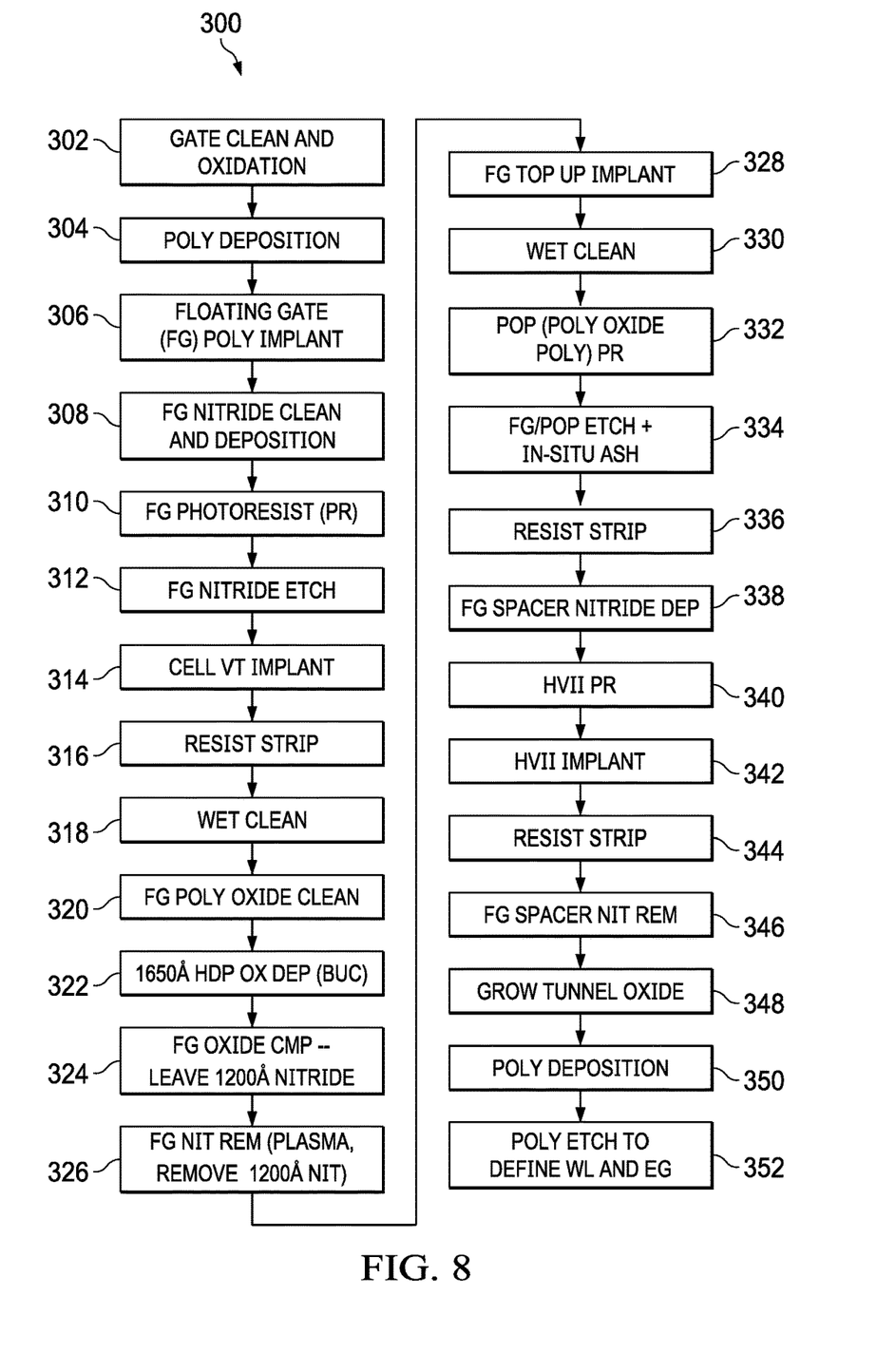
FIG. 8 illustrates a more detailed example method of forming the example memory cell shown in FIG. 6.

FIG. 8 illustrates another example method 300 of forming the example memory cell structure 200 shown in FIG. 6. At 302, a gate clean oxidation is performed on a top surface of substrate 202. At 304, a FG poly (poly1) layer is deposited over the substrate 202. At 306, a FG poly implant is performed. At 308, a FG nitride clean and deposition is performed. At 310, a FG photoresist is formed. At 312, a FG nitride etch is performed. At 314, a cell Vt (voltage threshold) implant is performed. At 316, a resist strip is performed. At 318, a wet clean is performed. At 320, a FG poly oxide clean is performed.

At 322, an HDP oxide deposition is performed over the floating gate structure, with a selected oxide thickness, e.g., in the range of 1000 Å-2500 Å, or in the range of 1300 Å-2000 Å, or in the range of 1500 Å-1800 Å, e.g., a thickness of about 1650 Å. At 324, a FG oxide CMP is performed, e.g., to a depth that leaves approximately 1200 Å of the nitride layer. At 326, a FG nitride removal may be performed, e.g., a plasma etch to remove the 1200A nitride thickness. At 328, a FG top up implant may be performed. At 330, a wet clean is performed. At 332, a POP (poly oxide poly) photoresist is formed. At 334, a FG/POP etch and in-situ ash process is performed. At 336, a resist strip is performed. At 338, a sacrificial FG nitride spacer is deposited over the structure. At 340, a HVII (High Voltage Ion Implant) photoresist is formed. At 342, an HVII source implant is performed. At 344, a resist strip is performed. At 346, the FG nitride spacer is removed. At 348, a tunnel oxide 108 may be formed, e.g., grown, over the structure. At 350, a poly2 layer is deposited over the structure. At 352, a poly2 etch may be performed to define the word line and erase gate.

The present invention has been described in terms of one or more preferred embodiments, and it should be appreciated that many equivalents, alternatives, variations, and modifications, aside from those expressly stated (e.g., methods of manufacturing, product by process, and so forth), are possible and within the scope of the invention.

The invention claimed is:

1. A method of forming a memory cell, the method comprising:
   forming a floating gate over a substrate;
   forming a word line over the floating gate such that the word line overlaps the floating gate by a first lateral distance; and
   forming an erase gate over the floating gate such that the erase gate overlaps the floating gate by a second lateral distance that is at least twice as large as the first lateral distance.

2. The method of claim 1, wherein the memory cell comprises a flash memory cell.

3. The method of claim 1, comprises forming a pair of floating gates of the memory cell, and forming a word line and erase gate over each floating gate,
   wherein for each floating gate, the respective word line overlaps the respective floating gate by a first respective lateral distance and the respective erase gate overlaps the respective floating gate by a second respective lateral distance that is at least twice as large as the first respective lateral distance.

4. The method of claim 3, wherein the erase gates for the pair of floating gates are provided by a shared gate.

5. The method of claim 1, wherein the word line and the erase gate are formed in a common poly layer.

6. The method of claim 1, wherein the floating gate is formed in a poly1 layer, and the word line and erase gate are formed in a poly2 layer.

7. The method of claim 1, wherein the second lateral distance is at least 5 times as large as the first lateral distance.

8. The method of claim 1, wherein, for a defined voltage level, the program current for the word line is at least 100 times as the program current for the erase gate or for a memory cell with symmetrical word line/erase gate overlap over the floating gate.

9. The method of claim 1, wherein, for a defined voltage level, the program current for the word line is at least 1,000 times as the program current for the erase gate or for a memory cell with symmetrical word line/erase gate overlap over the floating gate.

10. A memory cell, comprising:
a substrate;
a floating gate formed over the substrate; and
a word line and an erase gate formed over the floating gate;
wherein the word line overlaps the floating gate by a first lateral distance, and the erase gate overlaps the floating gate by a second lateral distance that is at least twice as large as the first lateral distance.

11. The memory cell of claim 10, wherein the memory cell comprises a flash memory cell.

12. The memory cell of claim 10, wherein the memory cell includes:
a pair of floating gates, and
a word line and an erase gate over each floating gate,
wherein for each floating gate, the respective word line overlaps the respective floating gate by a first respective lateral distance and the respective erase gate overlaps the respective floating gate by a second respective lateral distance that is at least twice as large as the first respective lateral distance.

13. The memory cell of claim 12, wherein the erase gates for the pair of floating gates are provided by a shared gate.

14. The memory cell of claim 10, wherein the word line and the erase gate comprises portions of a common poly layer.

15. The memory cell of claim 10, wherein the floating gate comprises a portion of a poly1 layer, and the word line and erase gate comprise portions of a poly2 layer.

16. The memory cell of claim 10, wherein the second lateral distance is at least 5 times as large as the first lateral distance.

17. The memory cell of claim 10, wherein, for a defined voltage level, the program current for the word line is at least 100 times as large as the program current for the erase gate or for a memory cell with symmetrical word line/erase gate overlap over the floating gate.

18. The memory cell of claim 10, wherein, for a defined voltage level, the program current for the word line is at least 1,000 times as large as the program current for the erase gate or for a memory cell with symmetrical word line/erase gate overlap over the floating gate.

19. A memory cell, comprising:
a substrate;
a floating gate formed over the substrate; and
a word line and an erase gate formed in a common poly layer over the floating gate;
wherein the word line overlaps the floating gate by a first lateral distance, and the erase gate overlaps the floating gate by a second lateral distance that is at least twice as large as the first lateral distance.

20. The memory cell of claim 19, wherein the floating gate comprises a portion of a poly1 layer, and the word line and erase gate comprise portions of a poly2 layer.

21. The memory cell of claim 19, wherein the second lateral distance is at least five times as large as the first lateral distance.

22. The memory cell of claim 19, wherein, for a defined voltage level, the program current for the word line is at least 100 times as the program current for the erase gate or for a memory cell with symmetrical word line/erase gate overlap over the floating gate.

23. A memory cell, comprising:
a pair of floating gates formed over a substrate;
a respective word line overlapping each floating gate by a respective word line lateral overlap distance; and
a shared gate located between and extending over both of the floating gates such that such that the shared gate overlaps each floating gate by a respective shared gate lateral overlap distance;
wherein for each floating gate, the respective shared gate lateral overlap distance is at least twice as large as the respective word line lateral overlap distance.

24. The memory cell of claim 23, wherein the shared gate defines a shared erase gate for performing erase functions for each floating gate.

25. The memory cell of claim 23, wherein the pair of word lines and the shared gate comprise portions of a common poly layer.

26. The memory cell of claim 23, wherein for each floating gate, the respective shared gate lateral overlap distance is at least five times as large as the respective word line lateral overlap distance.

* * * * *